United States Patent

Losco

Patent Number: 5,793,160
Date of Patent: Aug. 11, 1998

[54] PLATFORM-BASED MULTIPLE FOIL HIGH CURRENT ELECTRODE ATTACHMENT FOR MEDIUM PRESSURE QUARTZ LAMPS

[75] Inventor: Dennis A. Losco, Harmony Township, N.J.

[73] Assignee: Superior Quartz Products, Inc., Phillipsburg, N.J.

[21] Appl. No.: 746,743

[22] Filed: Nov. 15, 1996

[51] Int. Cl.⁶ .................................................. H01J 61/36
[52] U.S. Cl. ........................... 313/623; 313/624; 313/625
[58] Field of Search .................................. 313/623, 624, 313/625

[56] References Cited

U.S. PATENT DOCUMENTS

| | | |
|---|---|---|
| 2,562,887 | 8/1951 | Beese . |
| 2,749,461 | 6/1956 | Hierholzer, Jr. et al. . |
| 2,962,615 | 11/1960 | Anton . |
| 3,211,941 | 10/1965 | Sanden et. al. . |
| 3,250,941 | 5/1966 | Wilson et al. . |
| 3,497,752 | 2/1970 | Peterson . |
| 3,715,615 | 2/1973 | Lavering . |
| 4,459,472 | 7/1984 | Triebel et al. . |
| 4,463,281 | 7/1984 | Triebel et al. . |
| 5,200,669 | 4/1993 | Dixon et al. ................... 313/623 |
| 5,264,759 | 11/1993 | Lewandowski et al. ........ 313/623 |
| 5,304,892 | 4/1994 | Lewandowski et al. ........ 313/623 |
| 5,369,329 | 11/1994 | Austad et al. . |

FOREIGN PATENT DOCUMENTS 2106312  4/1983  United Kingdom .

*Primary Examiner*—Nimeshkumar Patel
*Attorney, Agent, or Firm*—Kenneth P. Glynn, Esq.

[57] ABSTRACT

A medium pressure quartz lamp for arc discharge illumination, includes a quartz envelope having opposite electrode ends with an electrode unit sealably attached to each of the opposite electrode ends. Each of the electrode units includes an electrode rod extending into the envelope and a platform physically attached to the rod. The platform has a melting point of at least 1.000° C. The electrode units also include at least one conductive, elongated metal foil which has a first end and a second end. The conductive elongated metal foil(s) are attached at their first end to the platform and attached at their second end to a terminal connector. Preferably, plural foils are utilized with a single platform attached to the electrode rod at their first ends and attached to a plurality of terminal connectors a their second ends. Present invention lamps, as a result of utilizing the conductor enhancing platform approximately doubles maximum operating current as compared to prior art lamps of otherwise similar configurations.

20 Claims, 2 Drawing Sheets

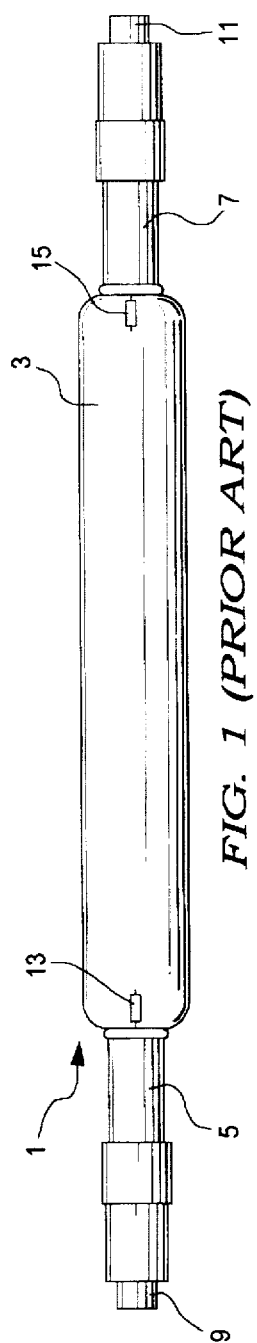
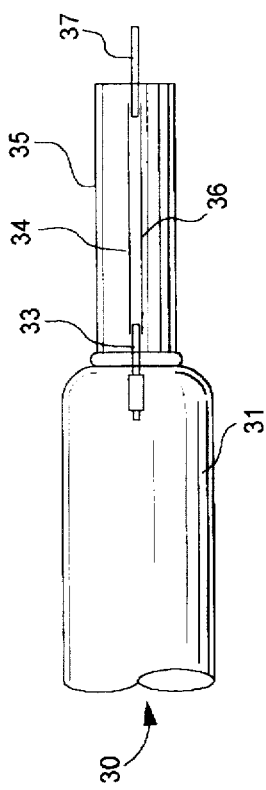
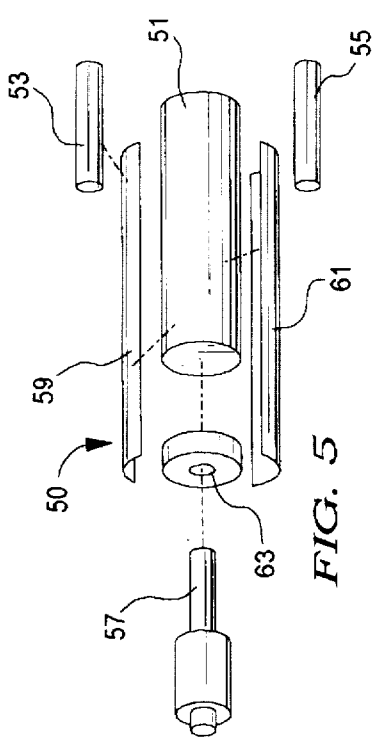
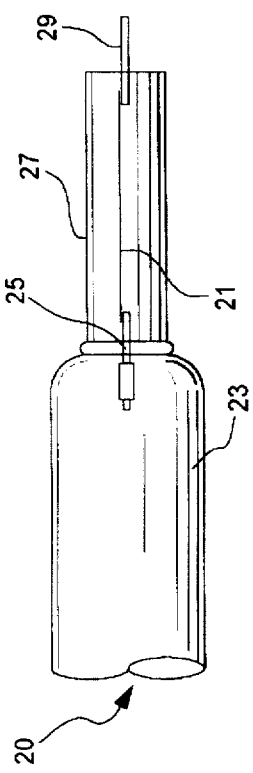
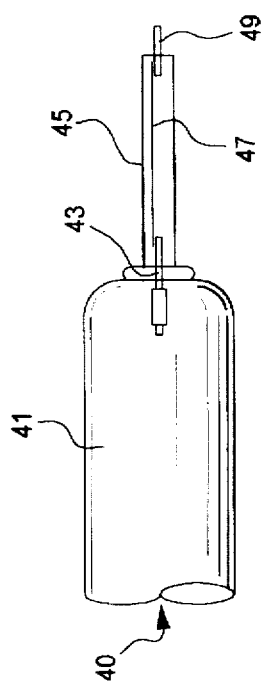
FIG. 1 (PRIOR ART)
FIG. 2 (PRIOR ART)
FIG. 3 (PRIOR ART)
FIG. 4 (PRIOR ART)
FIG. 5

PLATFORM-BASED MULTIPLE FOIL HIGH CURRENT ELECTRODE ATTACHMENT FOR MEDIUM PRESSURE QUARTZ LAMPS

BACKGROUND OF THE INVENTION

1. Field of the Invention

The present invention involves medium pressure quartz lamps utilizing mercury and/or metal halide. More particularly, these lamps have very high maximum operating currents relative to similar prior art lamps, resulting from the inclusion of current enhancing platforms in the electrode units.

2. Information Disclosure Statement

The following patents represent the State of the Art for various vapor lamps. They do not teach or suggest the use of current enhancing platforms, nor are they necessarily directed to medium pressure lamps:

U.S. Pat. No. 2,562,887 to N. C. Beese relates to a vapor lamp which comprises an envelope of glass resistant to caesium at temperatures between about 307° and 325° C. electrodes in and between. A discharge occurs upon the application of electrical energy. The envelope is generally cylindrical and has a diameter between 1 and 1½ inches and a length between 4 and 6 inches. It also includes an ionizable medium in the envelope which consists of argon at a pressure between 5 and 30 centimeters, admixed with between 0.2 and 0.5 gram of caesium.

U.S. Pat. No. 2,749,461 to Frank J. Hierholzer, et al. relates to a lamp unit which includes a combination of an electric discharge device, an envelope enclosing the device and also has dome and neck portions. There is also an inwardly opening central pocket in the dome portion, a flare tube closing the neck portion, a frame holding the device in the envelope, the neck end of the frame being connected to the flare tube, transversely extending spring elements centering the frame in the neck portion. The device includes an annular portion connected to the dome end of the frame and a plurality of fingers extending from the annular portion, into and engaging the inner surface of the pocket, for centering purposes. The fingers are placed under compression upon the insertion of the discharge device in the outer envelope to enable longitudinal movement of the discharge device during operation due to expansion and contraction of the frame without deviation of the discharge device from its longitudinal axis in the outer envelope.

U.S. Pat. No. 2,962,615 to Nicholas Anton, relates to a radiation detector tube of the type for detecting alpha, beta and gamma radiation which includes a gas tight envelope which has a hollow axially symmetrical conductive cathode, a radiation-permeable window sealed across one end of the cathode, an insulator sealed at the other end of the cathode, and an anode wire mounted in cantilever fashion and sealed to the insulator and extending coaxially within the cathode and terminating the adjacent window. The improvement which includes an anode support structure which has an insulating sleeve positioned along the anode wire adjacent to the unsupported end of the anode, and extending beyond the free tip of the anode, and a support member engaging the insulating sleeve and the cathode to hold the insulating sleeve in a fixed position to prevent the anode wire from vibrating.

U.S. Pat. No. 3,211,941 to J. Sanden et al. relates to an electric incandescent lamp which includes a tubular envelope having a filament coil extending axially of the envelope. It also includes at least one support member supporting the filament from the envelope wall, the support member formed from a single wire length bent to form a retroverted mid-section having its bright portion engageable with the envelope wall and tow clamping legs extending from the mid-section. The legs have cooperating adjacent clamping portions thereof intermediate their lengths, at least one clamping portion being curved so that between then they embrace the filament coil and engage it at least at three points around its periphery. The clamping legs have their free ends beyond the clamping portions extending divergently away from the filament into engagement with the envelope wall. The clamping legs at their clamping portions crossing over at least one side of the filament cover.

U.S. Pat. No. 3,250,941 to J. Wilson et al. relates to a compact source lamp which includes a vitreous envelope which has a tubular portion. There are pinch seals at opposite ends of the envelope through which extend inleads each which include a foil portion hermetically sealed through the pinch seal and a rod-like portion projecting into the envelope. There are electrodes which have their outer ends attached to the inner ends of the rod-like portions which define a short interelectrode gap. The foil portion is associated with at least one of the electrodes being insufficiently rigid to support the electrode vertically. At least one support member comprising a wire coiled around the one electrode at its outer end and having an expanded turn bearing against the wall of the vitreous envelope at the tubular portion.

U.S. Pat. No. 3,497,752 to Carl L. Peterson, relates to a quartz halogen lamp having a connector coil at the end of a filament leg to physically support the filament and make an electrical connection to a lead-in wire. The coil encircles the lead-in wire and has two arms in an overlapping, compressive engagement which constricts the coil in its direction of winding and thereby clamps it on the wire. There is similar coil, that has arms which press against the lamp envelope, thereby supporting the interior end of the filament mount.

U.S. Pat. No. 3,715,615 to Gordon R. Lavering, relates to an electrode support structure for use in a short arc lamp. The structure includes a ring having a plurality of flaps formed therein. Struts are attached to the electrode and to the flaps. These struts may be straight and may be abutted to the electrode. The flaps can bend to minimize the stresses created by the contraction and expansion of the struts relative to the ring during the temperature cycling of assembly and operation.

U.S. Pat. No. 4,463,281 to Walter Tribel et al. relates to a high-pressure electric discharge lamp which includes a support part surrounding each electrode rod. Each electrode rod has a spring wound therearound and presses the respective support part toward an electrode mounted at the end of the respective electrode rods. This arrangement includes a part of an assembly which is then mounted into envelope necks which extend from respective opposite ends of a quartz glass envelope which defines the discharge space of the lamp. A narrowing area is defined at the transition of the envelope necks to the envelope. The supporting parts each have a rounded end resting against a respective inclined surface defined by the narrowings at the transitions between the envelope necks and the envelope. The springs resiliently bias the supporting parts against the inclined inner surfaced of the narrowings. Also disclosed is a method of manufacture of the above described high-pressure electric discharge lamp.

U.S. Pat. No. 4,463,281 to Walter Triebel et al. relates to a high-pressure electric discharge lamp which includes a support part which surrounds each electrode rod, each electrode rod has a spring wound therearound and presses the respective support part toward an electrode mounted at the end of the respective electrode rods. This arrangement includes a part of an assembly which is then mounted into envelope necks which extend from respective opposite ends of a quartz glass envelope which defines the discharge space of the lamp. A narrowing area is defined at the transition of the envelope neck to the envelope. The supporting parts each have a rounded end resting against a respective inclined surface defined by the narrowings at the transition between the envelope necks and the envelope. The springs resiliently bias the supporting parts against the inclined inner surfaces of the narrowings. Also disclosed is a method of manufacture of the above described high-pressure electric discharge lamp.

U.S. Pat. No. 4,559,472 to Walter Triebel et al. relates to a high-pressure discharge lamp having a glass enclosure defining a discharge space. Envelope portions extending away from the discharge space are provided with elongate electrode portions extending respectively through the envelope portions. These electrode portions carry respective electrode portions at their inner ends and the electrode portions are sealed hermetically to the respective envelope portions. In order to support the electrode portions within the envelope portions, respective support elements are fitted around the electrode portions in space relation to the envelope portions. Means including a respective resilient element engaging each support member, are provided to hold the support elements in their axial position around the respective electrode portions. The resilient elements are each held between the respective electrode and the inner surface of the respective support element to continuously urge the axially outer surface of the support element resiliently against the respective sealing means.

UK Patent Application No. GB 2 106 312 A relates to a high pressure discharge lamp including a lamp envelope having a lamp bulb and at least one leg member attached to the bulb. An electrode shank within the leg member, carrying an electrode; a reinforcing abutment formed on the inside surface of the wall of the leg member; and a support clip arranged to resiliently engage the shank and the reinforcing abutment to form a resilient support for the shank within the leg member.

U.S. Pat. No. 5,369,329 relates to a short arc discharge lamp having a quartz envelope with a bulb and a plurality of arms having a specified cross-section, and one or more electrode rods are supported within the lamp arms for specific alignment. Support elements for the electrode rods are made of high temperature metal and have a flat central portion with a central orifice of sufficient dimension to permit one of the electrode rods to pass into the central orifice, and have at least two legs, and preferably four legs, radially extending from the flat central portion. The legs have outer portions terminating with pods formed at substantially right angles to the flat central portion of the support element, the legs being of sufficient length to fit the envelope arms so as to contact an inside surface of the envelop arms with the pods. There is also provided means for securing the support elements within the envelope arms.

Notwithstanding the prior art, the present invention is neither taught nor rendered obvious thereby.

SUMMARY OF THE INVENTION

A medium pressure quartz lamp for arc discharge illumination, includes a quartz envelope which has opposite electrode ends with an electrode unit sealably attached to each of the opposite electrode ends. Each of the electrode units include an electrode rod extending into the envelope and a platform physically attached to the rod. The platform has a melting point of at least 1,000° C. The electrode units also include at least one conductive, elongated metal foil which has a first end and a second end. The conductive elongated metal foil(s) are attached at their first end to the platform and attached at their second end to a terminal connector. In one preferred embodiment, plural foils are utilized with a single platform attached to the electrode rod at their first ends and attached to a plurality of terminal connectors a their second ends. In another preferred embodiment plural foils are utilized with two platforms. a first platform connected to the electrode rod and second platform connected to the terminal connectors with the first end of the foils connected to the first platforms and the second end of the foils connected to the second platform. Present invention lamps, as a result of utilizing the conductor enhancing platform approximately doubles maximum operating current as compared to prior art lamps of otherwise similar configurations.

BRIEF DESCRIPTION OF THE DRAWINGS

The present invention should be more fully understood when the specification herein is taken in conjunction with the drawings appended hereto wherein:

FIG. 1 illustrates a side view of a prior art linear medium pressurized gas vapor lamp;

FIG. 2 shows a cut side view of one end of a prior art single foil mercury vapor lamp;

FIG. 3 illustrates a side view of a dual foil prior art mercury vapor lamp;

FIG. 4 shows a typical prior art sealed electrode lamp;

FIG. 5 shows an exploded side oblique view of a present invention lamp electrode unit;

DETAILED DESCRIPTION OF THE PRESENT INVENTION

Figure 9:
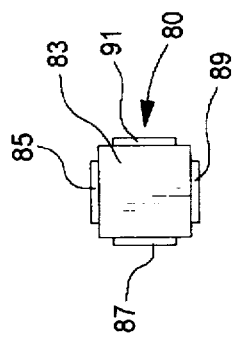
FIG. 9 shows an end view with four foils attached thereto.

In the present invention, medium pressure quartz lamps typically include electrode units at each end which contain electrode rods, foils and terminals. The metal foils are necessary to conduct from the terminal to the electrode rod within the lamp to achieve desired current levels for illumination. These medium pressure lamps are typically mercury vapor lamps and metal halide lamps and are used in such applications as ultra violet light curing, drying, printing and the like and are used in industries such as semiconductor manufacturing. FIG. 1 shows a side view of a typical prior art linear medium pressure gas vapor lamp 1. It includes the quartz bulb 3, electrode units shown generally as units 5 and 7 and electrical connectors 9 and 11 which extend from each electrode unit 5 and 7 respectively. This prior art medium pressure lamp dosed with an inert gas, could contain mercury vapor, metal halide or both. Typically, the lamp arc lengths (from electrode 13 to electrode 15) would be from as short as about 1 inch to as long as 180 inches or more. Power levels vary from about 100 to 1200 watts per inch of arc length.

It has been discovered by the inventor herein that the maximum operating currents are governed in part, in these linear medium pressure lamps by the limitations of the weld connections between the electrode rods and the foils and at the use of a conductive platform between the foil and the electrode rod surprisingly, substantially increase the maximum operating current. Thus, FIGS. 2, 3 and 4 all illustrate prior art electrode units which achieve around 20 amps maximum operating current.

FIG. 2 shows a cut side view of one end of a typical single foil mercury vapor lamp 20. Lamp 20 includes bulb or envelope 23, electrode rod 25, electrode unit 27, foil 21 and terminal connector 29. As can be seen, foil 21 is welded directly to electrode rod 25 and directly to terminal connector 29.

FIG. 3 illustrates a side view of a typical parallel dual foil lamp 30 having bulb 31, electrode rod 33 contained within electrode unit 35 and with terminal connector 37. Foils 34 and 36 are both welded at one end to electrode rod 33 and at the other end to terminal connector 37, as shown.

FIG. 4 shows a typical press sealed electrode lamp 40. This includes envelope 41, electrode rod 43, electrode unit 45, foil 47 and terminal connector 49. In the prior art lamps 20 and 30 shown on FIGS. 2 and 3, respectively, the foil connections are welded and contained within the electrode unit 27 and electrode unit 35, respectively, wherein they are sealed under vacuum to a solid piece of quartz in a cylindrical shape. Lamp 30 also contains a thin wafer of quartz between the two foils. In lamp 40 illustrated in FIG. 4, foil 47 is welded and press sealed into a solid quartz electrode unit 45. The FIG. 4 prior art electrode unit 45 is pressed and sealed to form a rectangular solid unit. Nonetheless, as illustrated in Table 1 below, maximum operating currents are relatively low and relatively similar for all of these prior art considerations.

Referring now to FIG. 5, there is shown an exploded side oblique view of one preferred embodiment of a present invention lamp assembly electrode unit 50. In FIG. 5, there is shown a core element 51 (quartz glass), terminal connectors 53 and 55, electrode rod 57 and dual foils 59 and 61. The critical feature of the present invention involves the use of platform 63. This is used for indirect connection of foils 59 and 61 to electrode rod 57, thus, maximum current capabilities have been discovered to be substantially increased by the use of a platform such as platform 63.

Figure 6:
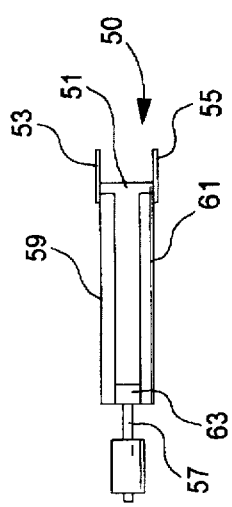
FIG. 6 shows an assembled view thereof.

FIG. 6 shows a side view of the elements shown in FIG. 5 but in an assembled state. Thus, identical elements are identically numbered. Foils 59 and 61 have been welded to platform 63 and electrode rod 57 has been connected to platform 63 by insertion with force fitting and/or welding.

Figure 7:
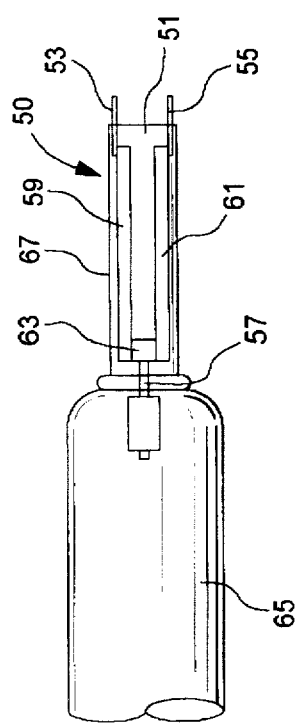
FIG. 7 shows the electrode unit within a lamp configuration.

Referring to FIG. 7 there is shown the same electrode unit 50 from FIGS. 5 and 6 but in its fully assembled state. Here, in this partial side view, envelope 65 is shown with electrode unit 50 connected thereto and sealed therewith. Note that the unit 50 shown in FIG. 6 is now encased in a quartz glass sealed and pressed tube 67. It was found that the maximum operating current for the present invention device shown in FIG. 7 was about 100% greater than prior art results.

The platform utilized in the present invention is preferably molybdenum, tungsten and any other metal with a melting point in excess of at least 1000° C. and preferably in excess of at least 1200° C. In preferred embodiments, the foil is molybdenum and the electrode rod is tungsten.

The platform, which is utilized to create a significant conductive surface area increase, may generally be a separate element and is preferably a separate element, such as shown in FIG. 5. It may be made of the same conductive material as the electrode rod or as the foil or may be made of a different material which is conductive and has a melting point of at least 1200° C. and preferably at least 1400° C., as mentioned. Additionally, the present invention should not be limited in shape as to the platform and core. While a round cross section is the simplest and may be the easiest to work with, other configurations such as square, rectangular oval, hexagonal and cross-sections may be used.

Figure 8:
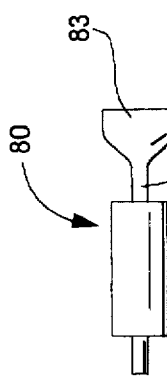
FIG. 8 shows an electrode rod element useful in a present invention lamp.

FIG. 8 shows an alternative embodiment, element 80, useful in a present invention lamp. Thus, electrode rod 81 has a unistructurally formed shape which includes an enlarged end platform 83. This platform need not be round and, as illustrated in FIG. 9, element 80 could have a square configuration for platform 83. Further, platform 83 is shown in FIG. 9 to have foils 85, 87, 89 and 91 attached thereto. However, present invention platforms could be used for a single foil or any reasonable number of foils.

Figure 10:
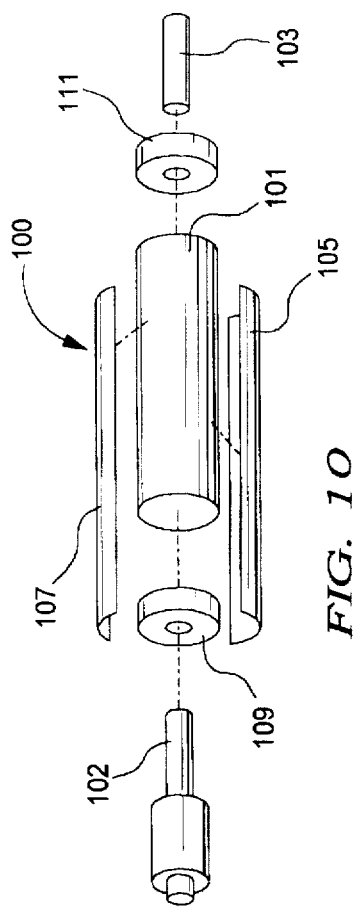
FIG. 10 shows a side oblique exploded view of another present invention electrode unit embodiment.
Figure 11:
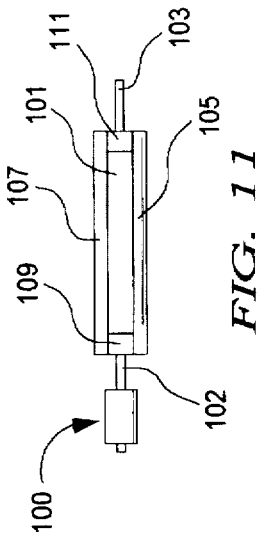
FIG. 11 shows a side view of it assembled.

FIG. 10 shows a side, oblique exploded view of a present invention electrode unit 100, and FIG. 11 shows a side assembled view thereof. This embodiment is similar to that which is shown in FIGS. 5, 6 and 7 except that two platforms are used instead of one, at opposite ends of the foils there is shown core 101, single terminal connector 103, foils 105 and 107, electrode rod 102 and platforms 109 and 111.

The following Table 1 illustrates maximum operating currents achieved utilizing the present invention lamps verses the prior art:

TABLE 1

| LAMP | MAX OPERATING CURRENT |
| --- | --- |
| FIG. 2 prior art | 18 amps |
| FIG. 3 prior art (dual foils) | 20 amps |
| FIG. 4 prior art (press sealed) | 22 amps |
| FIG. 7 present invention | 40 amps |
| Quadruple foil present invention | 50 amps |

As Table 1 illustrates the present invention achieves an increase of about 100% maximum operating current over the prior art lamps.

Obviously, numerous modifications and variations of the present invention are possible in light of the above teachings. It is therefore understood that within the scope of the appended claims, the invention may be practiced otherwise than as specifically described herein.

What is claimed is:

1. A medium pressure quartz lamp for arc discharge illumination, comprising:
   (a) a quartz envelope having opposite electrode ends; and,
   (b) an electrode unit attached at each of said opposite electrode ends of said quartz envelope and being sealably connected thereto, each of said electrode units including:
     (i) an electrode rod extending into said envelope and being in direct contact with said envelope;
     (ii) a platform physically attached to said rod, and having a melting point of at least 1,200° C.;
     (iii) at least one conductive elongated metal foil having a first end and a second end, said at least one conductive elongated metal foil being attached at its first end to said platform and attached at its second end to a terminal connector and not in direct contact with said electrode rod; and, (iv) at least one terminal connector attached to said at least one conductive elongated metal foil.

2. The lamp of claim 1 wherein two foils and two terminal connectors are included within each of said electrode units and each of said two foils are connected to separate terminal connectors.

3. The lamp of claim 1 wherein said platform is a metal selected from tungsten and molybdenum.

4. The lamp of claim 2 wherein said platform is a metal selected from tungsten and molybdenum.

5. The lamp of claim 1 wherein said electrode unit is contained within a negative pressurized, sealed quartz glass cover.

6. The lamp of claim 2 wherein said electrode unit is contained within a negative pressurized, sealed quartz glass cover.

7. The lamp of claim 1 wherein said lamp is dosed with an inert gas and contains mercury, metal halide or mercury and metal halide.

8. The lamp of claim 2 wherein said lamp dosed with an inert gas, contains mercury, metal halide or mercury and metal halide.

9. The lamp of claim 1 wherein said platform is a separate element attached to said electrode rod.

10. The lamp of claim 2 wherein said platform is unistructurally formed at one end of said electrode rod.

11. A medium pressure quartz lamp for arc discharge illumination, comprising:

(a) a quartz envelope having opposite electrode ends; and, (b) an electrode unit attached at each of said opposite electrode ends of said quartz envelope and being sealably connected thereto, each of said electrode units including:

(i) an electrode rod extending into said envelope;

(ii) a first platform physically attached to said rod, and having a melting point of at least 1,200° C.;

(iii) a second platform having a melting point of at least 1,200° C.;

(iv) at least one conductive elongated metal foil having a first end and a second end, said at least one conductive elongated metal foil being attached at its first end to said first platform and at its second end attached to said second platform, said elongated foil not being in direct contact with said electrode rod; and (v) a terminal connector attached to said second platform.

12. The lamp of claim 11 wherein two foils are included within each of said electrode units and each of said two foils are attached at its first end to said first platform and at its second end to said second platform.

13. The lamp of claim 11 wherein said first and second platforms are a metal selected from tungsten and molybdenum.

14. The lamp of claim 12 wherein said first and second platform are a metal selected from tungsten and molybdenum.

15. The lamp of claim 11 wherein said electrode unit is contained within a negative pressurized, sealed quartz glass cover.

16. The lamp of claim 12 wherein said electrode unit is contained within a negative pressurized, sealed quartz glass cover.

17. The lamp of claim 11 wherein said lamp dosed with an inert gas, contains mercury, metal halide or mercury and metal halide.

18. The lamp of claim 12 wherein said lamp dosed with an inert gas, contains mercury, metal halide or mercury and metal halide.

19. The lamp of claim 11 wherein said first platform is a separate element attached to said electrode rod.

20. The lamp of claim 11 wherein said first platform is unistructurally formed at one end of said electrode rod.

* * * * *